US011758828B2

(12) United States Patent
Abdo

(10) Patent No.: US 11,758,828 B2
(45) Date of Patent: *Sep. 12, 2023

(54) HIGH-SATURATION POWER JOSEPHSON RING MODULATORS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/489,150

(22) Filed: Sep. 29, 2021

(65) Prior Publication Data

US 2022/0020912 A1 Jan. 20, 2022

Related U.S. Application Data

(63) Continuation of application No. 17/135,631, filed on Dec. 28, 2020, now Pat. No. 11,264,554, and a
(Continued)

(51) Int. Cl.
*H10N 60/80* (2023.01)
*G06N 10/00* (2022.01)
(Continued)

(52) U.S. Cl.
CPC .......... *H10N 60/805* (2023.02); *G06N 10/00* (2019.01); *H03D 7/005* (2013.01); *H03H 11/34* (2013.01);
(Continued)

(58) Field of Classification Search
CPC . H03L 39/025; H03L 39/223; H03L 39/2493; G06N 10/00; G06N 99/022;
(Continued)

(56) References Cited

U.S. PATENT DOCUMENTS 9,697,473 B2 * 7/2017 Abdo ................. H01L 39/2493
2007/0049097 A1 3/2007 Hirano et al.
(Continued)

FOREIGN PATENT DOCUMENTS

JP 6265612 * 9/1994 .......... G01R 33/035
JP 2014188467 10/2014
WO 2016138406 A1 9/2016

OTHER PUBLICATIONS

Machine Translation for JP 6265612, 7 pages (Year: 1994).*
(Continued)

*Primary Examiner* — Diana J. Cheng
(74) *Attorney, Agent, or Firm* — Amin, Turocy & Watson, LLP

(57) ABSTRACT

High-saturation power Josephson ring modulators and fabrication of the same are provided. A Josephson ring modulator can comprise a plurality of matrix junctions. Matrix junctions of the plurality of matrix junctions can comprise respective superconducting parallel branches that can comprise a plurality of Josephson junctions operatively coupled in a series configuration. A method can comprise forming a first matrix junction comprising arranging a first group of Josephson junctions as first parallel branches. The method can also comprise forming a second matrix junction comprising arranging a second group of Josephson junctions as second parallel branches. Further, the method can comprise forming a third matrix junction comprising arranging a third group of Josephson junctions as third parallel branches. In addition, the method can comprise forming a fourth matrix junction comprising arranging a fourth group of Josephson junctions as fourth parallel branches.

20 Claims, 10 Drawing Sheets

Related U.S. Application Data continuation of application No. 16/166,211, filed on Oct. 22, 2018, now Pat. No. 11,139,424.

(51) Int. Cl.
*H03D 7/00* (2006.01)
*H03H 11/34* (2006.01)
*H03K 3/38* (2006.01)
*H10N 60/12* (2023.01)
*H10N 60/01* (2023.01)
*H03F 19/00* (2006.01)

(52) U.S. Cl.
CPC ........... *H03K 3/38* (2013.01); *H10N 60/0912* (2023.02); *H10N 60/12* (2023.02); *H03F 19/00* (2013.01)

(58) Field of Classification Search
CPC ........... H03D 7/005; H03J 11/34; H03K 3/38; H03K 17/92; H03F 19/00; G01R 33/035
See application file for complete search history.

(56) References Cited

U.S. PATENT DOCUMENTS

| | | |
|---|---|---|
| 2008/0129368 A1 | 6/2008 | Furuta et al. |
| 2010/0026538 A1 | 2/2010 | Herr et al. |
| 2010/0207622 A1 | 8/2010 | Finkler et al. |
| 2017/0229632 A1 | 8/2017 | Abdo |
| 2017/0229633 A1 | 8/2017 | Abdo |
| 2018/0054165 A1 | 2/2018 | Szoecs et al. |
| 2018/0091143 A1 | 3/2018 | Abdo |
| 2018/0341874 A1 | 11/2018 | Puri et al. |

OTHER PUBLICATIONS

U.S. Appl. No. 16/166,211, filed Oct. 22, 2018.
U.S. Appl. No. 17/135,631, filed Dec. 28, 2020.
Final Office Action received for U.S. Appl. No. 17/135,631 dated Nov. 23, 2021, 11 pages.
Abdo et al., "Nondegenerate three-wave mixing with the Josephson ring modulator," Physical Review B, 2013, vol. 87, 014508, American Physical Society, 18 pages.
Bergeal et al., "Phase-preserving amplification near the quantum limit with a Josephson ring modulator," Nature, May 2010, p. 64 69, vol. 465, Macmillan Publishers Limited, 6 pages.
Abdo et al., "Josephson amplifier for qubit readout," Applied Physics Letters, 2011, vol. 99, 162506, American Institute of Physics, 4 pages.
Narla et al., "Wireless Josephson amplifier," Applied Physics Letters, 2014, vol. 104, 232605, AIP Publishing LLC, 6 pages.
Roch et al., "Widely Tunable, Nondegenerate Three-Wave Mixing Microwave Device Operating near the Quantum Limit," Physical Review Letters, 2012, vol. 108, 147701, American Physical Society, 5 pages.
International Search Report and Written Opinion for International Application No. PCT/EP2019/076511 dated Dec. 20, 2019, 16 pages.
Liu G et al: "Josephson parametric converter saturation and higher order effects", arxiv.org, Cornell University Libra Y, 201 Olin Library Cornell University Ithaca, NY 14853, Mar. 13, 2017 (Mar. 13, 2017), XP081292818, DOI: 10.1063/1.5003032 col. 2, paragraph 2, figure Fig. 1(a).
Joseph Kerckhoff et al: "On-chip superconducting microwave circulator from synthetic rotation", arxiv.org, Cornell University Library, 201 Olin Library Cornell University Ithaca, NY 14853, Feb. 21, 2015 (Feb. 21, 2015), XP081331158, DOI: 10.1103/PHYSREVAPPLIED.4.034002 figures 2, 4, 6.
Zorin A B et al: "Traveling-Wave Parametric Amplifier Based on Three-Wave Mixing in a Josephson Metamaterial", 2017 16th International Superconductive Electronics Conference (ISEC), IEEE, Jun. 12, 2017 (Jun. 12, 2017), pp. 1-3, XP033330098, DOI: 10.1109/ISEC.2017.8314196 [retrieved on Mar. 9, 2018] figure 1.
Non-Final Office Action received for U.S. Appl. No. 16/166,211 dated Aug. 16, 2019, 35 pages.
Final Office Action received for U.S. Appl. No. 16/166,211 dated Feb. 21, 2020, 17 pages.
Non-Final Office Action received for U.S. Appl. No. 16/166,211 dated Jun. 25, 2020, 21 pages.
List of IBM Patents or Patent Applications Treated as Related.
Final Office Action received for U.S. Appl. No. 16/166,211 dated Jan. 11, 2021, 25 pages.
Non-Final Office Action received for U.S. Appl. No. 17/135,631 dated Jul. 19, 2021, 47 pages.

\* cited by examiner

HIGH-SATURATION POWER JOSEPHSON RING MODULATORS

BACKGROUND

A Josephson ring modulator is a dispersive nonlinear three-wave mixing element. A basic Josephson ring modulator comprises four Josephson arranged in a Wheatstone-bridge configuration. The Josephson ring modulator supports two differential modes and two common modes. By coupling the Josephson ring modulator to a suitable electromagnetic environment (e.g., which supports two differential microwave modes), the device can be used to perform various quantum processing operations such as lossless frequency conversion, parametric amplification at the quantum limit, and generation of two-mode squeezing.

A Josephson ring modulator that comprises four Josephson junctions arranged in a Wheatstone-bridge configuration (e.g., a first Josephson junction in a first arm of the Josephson ring modulator, a second Josephson junction in a second arm of the Josephson ring modulator, a third Josephson junction in a third arm of the Josephson ring modulator, and a fourth Josephson junction in the fourth arm of the Josephson ring modulator) is very nonlinear (e.g., the Josephson ring modulator can function as a strong dispersive nonlinear medium) but the Josephson ring modulator can tolerate relatively low microwave powers.

A Josephson ring modulator that contains more than one Josephson junction in respective arms of the Josephson ring modulator is weakly nonlinear (e.g., functions as a weak dispersive nonlinear medium, which needs to be pumped with stronger drive to achieve the same amount of mixing as the one Josephson junction counterpart), but the Josephson ring modulator is able to tolerate relatively high microwave powers (because of the array of Josephson junctions). However, Josephson ring modulators fabrication of the same can be improved.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein are devices, systems, methods, computer-implemented methods, methods, apparatuses, and/or computer program products that facilitate fabrication of cryogenic combiners and/or separators of direct currents and microwave signals for quantum applications.

According to an embodiment, a Josephson ring modulator can comprise a plurality of matrix junctions. Matrix junctions of the plurality of matrix junctions can comprise respective superconducting parallel branches that can comprise a plurality of Josephson junctions operatively coupled in a series configuration. An advantage of such a Josephson ring modulator is a strong nonlinearity while tolerating relatively high microwave powers.

In accordance with another embodiment, a method can comprise forming a plurality of matrix junctions. Forming the plurality of matrix junctions can comprise arranging a plurality of Josephson junctions as sets of superconducting parallel branches. Further, forming the plurality of matrix junctions can comprise arranging, in a series configuration, a first pair of superconducting parallel branches of the sets of superconducting parallel branches and a second pair of superconducting parallel branches of the sets of superconducting parallel branches. The first pair of superconducting parallel branches can be in a parallel configuration with the second pair of superconducting parallel branches. An advantage of such a method is that a Josephson ring modulator can be formed that comprises a strong nonlinearity while tolerating relatively high microwave powers.

According to another embodiment, a superconducting device can comprise a Josephson ring modulator that can comprise a plurality of matrix junctions. The matrix junctions of the plurality of matrix junctions can comprise superconducting parallel branches that comprise a plurality of Josephson junctions in a series configuration. An advantage of such a superconducting device is that the superconducting device can obtain a strong nonlinearity while tolerating relatively high microwave powers.

In accordance with another embodiment, a Josephson ring modulator can comprise a first matrix junction comprising a first group of Josephson junctions arranged as first parallel branches. The Josephson ring modulator can also comprise a second matrix junction comprising a second group of Josephson junctions arranged as second parallel branches. Further, the Josephson ring modulator can comprise a third matrix junction comprising a third group of Josephson junctions arranged as third parallel branches. In addition, the Josephson ring modulator can comprise a fourth matrix junction comprising a fourth group of Josephson junctions arranged as fourth parallel branches. An advantage of such a Josephson ring modulator is that the Josephson ring modulator can obtain a strong nonlinearity while tolerating relatively high microwave powers.

According to a further embodiment, a method can comprise forming a first matrix junction comprising arranging a first group of Josephson junctions as first parallel branches. The method can also comprise forming a second matrix junction comprising arranging a second group of Josephson junctions as second parallel branches. Further, the method can comprise forming a third matrix junction comprising arranging a third group of Josephson junctions as third parallel branches. In addition, the method can comprise forming a fourth matrix junction comprising arranging a fourth group of Josephson junctions as fourth parallel branches. An advantage to such a method is that a superconducting device can be formed that can have a strong nonlinearity while tolerating relatively high microwave powers.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
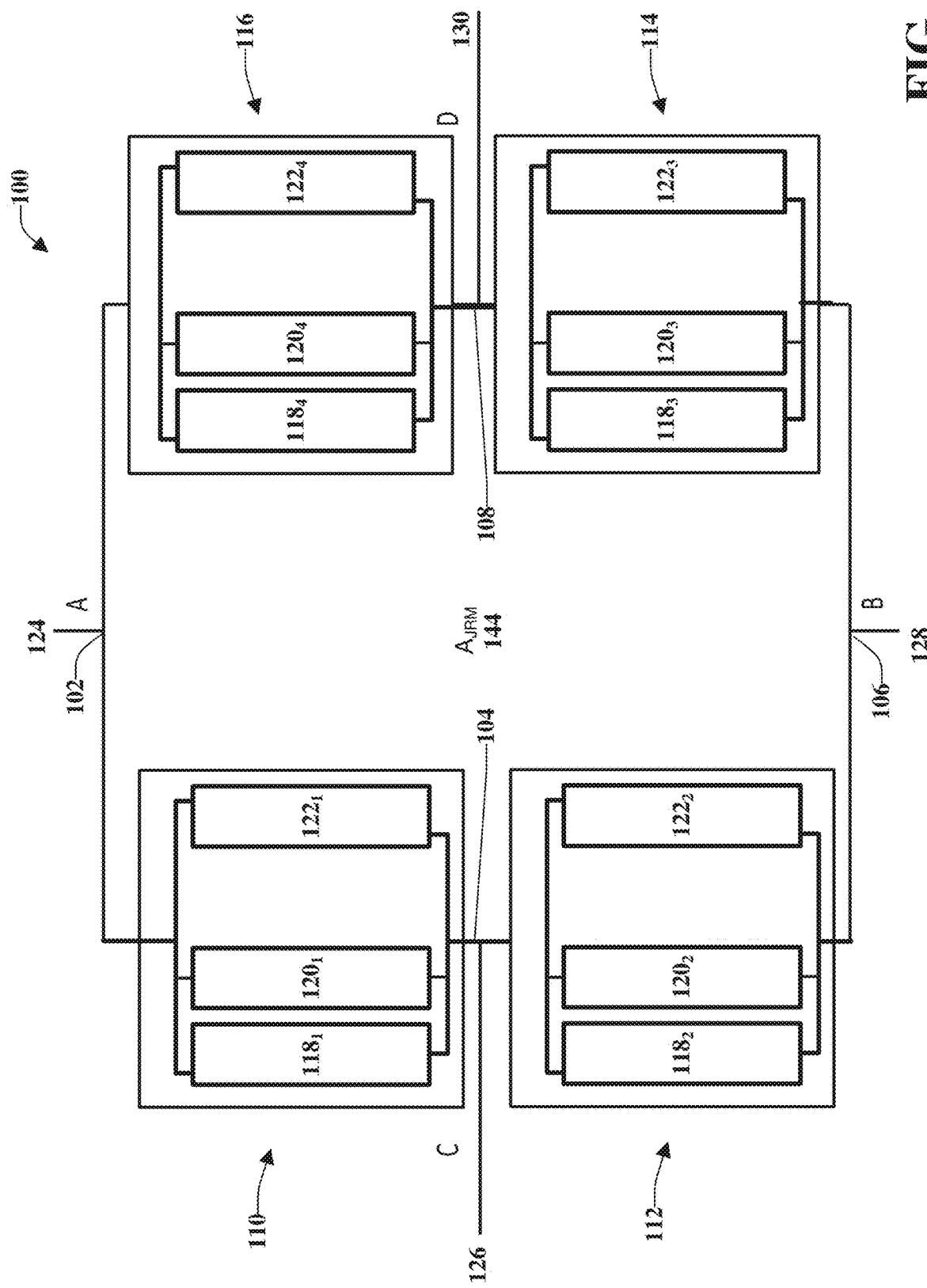
FIG. 1 illustrates an example, non-limiting, Josephson ring modulator in accordance with one or more embodiments described herein.

FIG. 1 illustrates an example, non-limiting, Josephson ring modulator (JRM) in accordance with one or more embodiments described herein. The JRM 100 can be utilized in a superconducting device, a quantum computing device, or the like.

As illustrated, the JRM 100 can comprise a first node 102 (e.g., Node A), a second node 104 (e.g., Node C), a third node 106 (e.g., Node B), and a fourth node 108 (e.g., Node D). A first matrix junction 110 can be operatively coupled between the first node 102 and the second node 104. A second matrix junction 112 can be operatively coupled between the second node 104 and the third node 106. A third matrix junction 114 can be operatively coupled between the third node 106 and the fourth node 108. Further, a fourth matrix junction 116 can be operatively coupled between the fourth node 108 and the first node 102.

Respective matrix junctions of the sets of matrix junctions (e.g., the first matrix junction 110, the second matrix junction 112, the third matrix junction 114, and the fourth matrix junction 116) can comprise superconducting parallel branches. According to some implementations, the respective matrix junctions can comprise at least two superconducting parallel branches. In some implementations, the respective matrix junctions can comprise between two and fifteen superconducting parallel branches. In some implementations, the respective matrix junctions can comprise more than fifteen superconducting parallel branches.

For example, the first matrix junction 110 can comprise a first group of at least two parallel branches, illustrated as a first superconducting branch $118_1$, a second superconducting branch $120_1$, through an Nth superconducting branch $122_1$, where N is an integer greater than or equal to zero. The first superconducting branch $118_1$, the second superconducting branch $120_1$, and the Nth superconducting branch $122_1$ can be operatively coupled in a parallel configuration to one another (e.g., a first set of superconducting parallel branches).

In a similar manner, the second matrix junction 112 can comprise a second group of at least two parallel branches, illustrated as a first superconducting branch $118_2$, a second superconducting branch $120_2$, through an Nth superconducting branch $122_2$. The first superconducting branch $118_2$, the second superconducting branch $120_2$, and the Nth superconducting branch $122_2$ can be operatively coupled in a parallel configuration to one another (e.g., a second set of superconducting parallel branches).

Further, the third matrix junction 114 can comprise a third group of at least two parallel branches, illustrated as a first superconducting branch $118_3$, a second superconducting branch $120_3$, through an Nth superconducting branch $122_3$. The first superconducting branch $118_3$, the second superconducting branch $120_3$, and the Nth superconducting branch $122_3$ can be operatively coupled in a parallel configuration to one another (e.g., a third set of superconducting parallel branches).

In addition, the fourth matrix junction 116 can comprise a fourth group of at least two parallel branches, illustrated as a first superconducting branch $118_4$, a second superconducting branch $120_4$, through an Nth superconducting branch $122_4$. The first superconducting branch $118_4$ the second superconducting branch $120_4$, and the Nth superconducting branch $122_4$ can be operatively coupled in a parallel configuration to one another (e.g., a fourth set of superconducting parallel branches).

The first set of superconducting parallel branches can be in a series configuration with the second set of superconducting parallel branches. Further, the third set of superconducting parallel branches can be in a series configuration with the fourth set of superconducting parallel branches. In addition, the first set of superconducting parallel branches and the second set of superconducting parallel branches can be operatively coupled in parallel with the third set of superconducting parallel branches and the fourth set of superconducting parallel branches.

Parallel branches of the first group, the second group, the third group, and the fourth group can comprise at least two Josephson junctions in the series configuration. The arrangement of the Josephson junctions will be described in further detail with respect to FIG. 2 below.

The JRM can be connected to respective circuitry (e.g., one or more microwave resonators) through respective contact points or nodes. For example, a first contact point 124 is provided with respect to the first node 102, a second contact point 126 is provided with respect to the second node 104, a third contact point 128 is provided with respect to the third node 106, and a fourth contact point 130 is provided with respect to the fourth node 108. Thus, a first microwave resonator can connect the first node 102 (Node A) and the third node 106 (Node B) and a second microwave resonator can connect the second node 104 (Node C) and the fourth node 108 (Node D). The microwave resonators can be transmission line resonators or lumped elements, for example.

Figure 2:
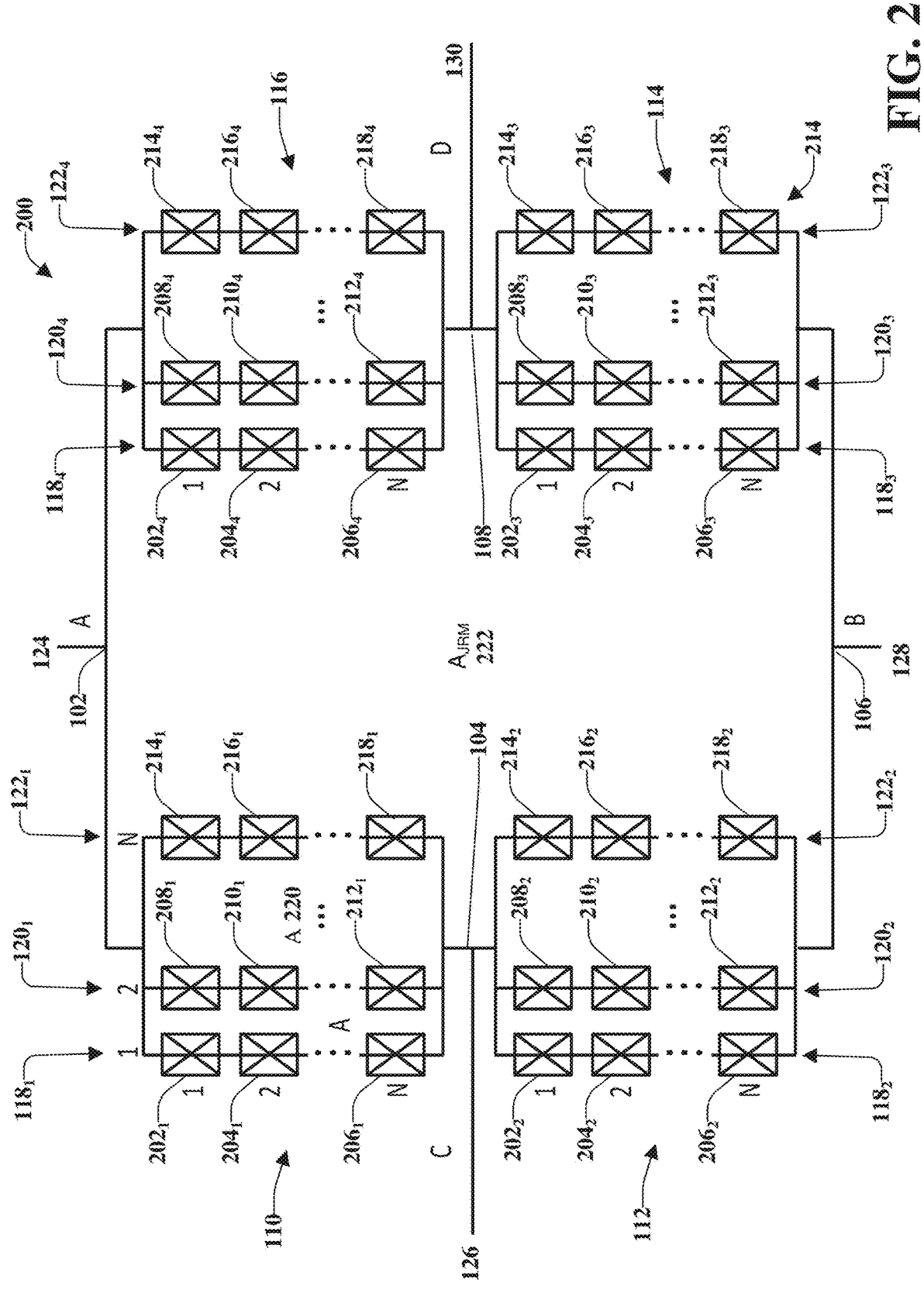
FIG. 2 illustrates another example, non-limiting, Josephson ring modulator in accordance with one or more embodiments described herein.

FIG. 2 illustrates another example, non-limiting, Josephson ring modulator in accordance with one or more embodiments described herein. Repetitive description of like elements employed in other embodiments described herein is omitted for sake of brevity. The JRM 200 can be utilized in a superconducting device, a quantum computing device, or the like.

As illustrated, the superconducting parallel branches of the at least two superconducting parallel branches (e.g., the first superconducting branch $118_1$, the second superconducting branch $120_1$, the Nth superconducting branch $122_1$, the first superconducting branch $118_2$, the second superconducting branch $120_2$, the Nth superconducting branch $122_2$, the first superconducting branch $118_3$, the second superconducting branch $120_3$, the Nth superconducting branch $122_3$, the first superconducting branch $118_4$, the second superconducting branch $120_4$, the Nth superconducting branch $122_4$), can comprise at least two Josephson junctions in a series configuration. In some implementations, superconducting parallel branches of the at least two superconducting parallel branches can comprise between two and fifteen Josephson junctions in a series configuration. In other implementations, superconducting parallel branches of the at least two superconducting parallel branches can comprise more than fifteen Josephson junctions in a series configuration.

For example, the first superconducting branch $118_1$ of the first matrix junction 110 can comprise a first Josephson junction $202_1$, a second Josephson junction $204_1$, through an Nth Josephson junction $206_1$, where N is an integer equal or greater than two (e.g., there can be two or more Josephson junctions). The second superconducting branch $120_1$ of the first matrix junction 110 can comprise a first Josephson junction $208_1$, a second Josephson junction $210_1$, through an Nth Josephson junction $212_1$. Further, the Nth superconducting branch $122_1$ of the first matrix junction 110 can comprise a first Josephson junction $214_1$, a second Josephson junction $216_1$, through an Nth Josephson junction $218_1$. It is noted that, as discussed herein, the number of N superconducting branches and the number of N Josephson junctions can be different numbers (e.g., the number of superconducting branches does not have to equal the number of Josephson junctions).

Further, the first superconducting branch $118_2$ of the second matrix junction 112 can comprise a first Josephson junction $202_2$, a second Josephson junction $204_2$, through an Nth Josephson junction $206_2$. The second superconducting branch $120_2$ of the second matrix junction 112 can comprise a first Josephson junction $208_2$, a second Josephson junction $210_2$, through an Nth Josephson junction $212_2$. Further, the Nth superconducting branch $122_2$ of the second matrix junction 112 can comprise a first Josephson junction $214_2$, a second Josephson junction $216_2$, through an Nth Josephson junction $218_2$.

In a similar manner, the first superconducting branch $118_3$ of the third matrix junction 114 can comprise a first Josephson junction $202_3$, a second Josephson junction $204_3$, through an Nth Josephson junction $206_3$. The second superconducting branch $120_2$ of the third matrix junction 114 can comprise a first Josephson junction $208_3$, a second Josephson junction $210_3$, through an Nth Josephson junction $212_3$. Further, the Nth superconducting branch $122_3$ of the third matrix junction 114 can comprise a first Josephson junction $214_3$, a second Josephson junction $216_3$, through an Nth Josephson junction $218_3$.

Additionally, the first superconducting branch $118_4$ of the fourth matrix junction 116 can comprise a first Josephson junction $202_4$, a second Josephson junction $204_4$, through an Nth Josephson junction $206_4$. The second superconducting branch $120_4$ of the fourth matrix junction 116 can comprise a first Josephson junction $208_4$, a second Josephson junction $210_4$, through an Nth Josephson junction $212_4$. Further, the Nth superconducting branch $122_4$ of the fourth matrix junction 116 can comprise a first Josephson junction $214_4$, a second Josephson junction $216_4$, through an Nth Josephson junction $218_4$.

In further detail, a JRM is a nonlinear dispersive element based on Josephson tunnel junctions that can perform three-wave mixing of microwave signals at the quantum limit. The JRM can comprise four nominally identical Josephson junctions arranged in Wheatstone bridge configuration (as illustrated in FIG. 1). In order to construct a non-degenerate parametric device that is a Josephson Parametric Converter (JPC), which is capable of amplifying and/or mixing microwave signals at the quantum limit, the JRM is incorporated into two microwave resonators at a radio frequency (rf)-current anti-node of their fundamental eigenmodes. As has been demonstrated in several experimental and theoretical works, the performances of these JPCs (namely power gain, dynamical bandwidth, and dynamic range), are strongly dependent on the critical current of the Josephson junctions of the JRM, the specific realization of the electromagnetic environment (e.g., the microwave resonators), and the coupling between the JRM and the resonators.

In order to enhance certain performances of JPCs, various microwave resonators have been realized and proposed. For example, proposed have been coplanar resonators, stripline resonators, microstrip resonators, compact/lumped-element resonators, and three-dimensional cavities. It has also been suggested to enhance the dynamic range of JPCs by enhancing the critical current of Josephson junctions that form the JRM, by for example using niobium junctions and nano-bridges. Moreover, it has been shown that the tunable bandwidth of JPCs can be increased by shunting the Josephson junctions of the JRM with linear inductance.

A conventional Josephson ring modulator can comprise four symmetrical arms. For example, a first symmetrical arm can be between the first node (e.g., Node A) and a second node (e.g., Node C), a second symmetrical arm can be between the second node and a third node (e.g., Node b), a third symmetrical arm can be between the third node and a fourth node (e.g., Node D), and a fourth symmetrical arm can be between the fourth node and the first node.

The symmetrical arms can comprise respective Josephson junctions. For example, a first Josephson junction can be operatively coupled between Node A and Node C, a second Josephson junction can be operatively coupled between Node C and Node B, a third Josephson junction can be operatively coupled between Node C and Node D, and a fourth Josephson junction can be operatively coupled between Node D and Node A. Thus, the first symmetrical arm comprises one Josephson junction, the second symmetrical arm comprises one Josephson junction, the third symmetrical arm comprises one Josephson junction, and the fourth symmetrical arm comprises one Josephson junction (e.g., a total of four Josephson junctions in the circuit).

In the type of configuration discussed above (e.g., a total of four Josephson junctions), the effective inductance can be realized between Node A and Node B (and similarly between Node C and Node D), which can be expressed as:

$$L_{tot}=2L\|2L_J=L_J \quad\quad\quad \text{Equation 1.}$$

where $L_j$ is the linear inductance of the Josephson junction and $L_{tot}$ is the total inductance. Thus, above described conventional JRM can have strong nonlinearity and a low-saturation power.

According to another example, a conventional Josephson ring modulator can be a multiple-Josephson junction JRM that comprises arrays of Josephson junctions. In this example, there can be one or more Josephson junctions coupled in series between the respective nodes. For example, a first set of one or more Josephson junctions can be operatively coupled, in series, between Node A and Node C, a second set of one or more Josephson junctions can be operatively coupled, in series, between Node C and Node B, a third set of one or more Josephson junctions can be operatively coupled, in series, between Node B and Node D, and a fourth set of one or more Josephson junctions can be operatively coupled, in series, between Node D and Node A.

In this type of configuration (e.g., conventional multiple-Josephson junction JRM), the effective inductance can be realized between Node A and Node B (and similarly between Node C and Node D), which can be expressed as:

$$L_{tot} = 2*N*L_J \| 2*N*L_J = N*L_J \quad \text{Equation 2.}$$

where N is the number of Josephson junctions. Thus, the above described conventional multiple-Josephson junction JRM can have weak nonlinearity and a high-saturation power.

As provided herein, the arms of the JRM (e.g., the JRM 200) can comprise a matrix of N*N Josephson junctions. Thus, there can be N superconducting parallel branches. Superconducting parallel branches of the N superconducting parallel branches can comprise N Josephson junctions in series. Accordingly, the largest area of the Josephson junction matrix (e.g., illustrated as an area A 220 of the first matrix junction 110) can be made small or comparable to an area of the JRM ($A_{JRM}$ 222). In an example, an advantage of making the area A 220 small compared to area $A_{JRM}$ 222 is that it can ensure that the device response is mainly determined by the flux threaded by the JRM loop and not by the inner superconducting loops in respective arms of the JRM. In another example, an advantage of making the area A 220 comparable to $A_{JRM}$ 222 is that it can decrease the rate of semi-periodic changes of total inductance of the JRM versus flux (e.g., increases the semi-periods of the JRM total-inductance as a function of threaded flux).

$$L_{branch} = N*L_J \| N*L_J \ldots \| N*L_J = L_J \quad \text{Equation 3.}$$

Where, $L_{branch} = N*L_J \| N*L_J \ldots \| N*L_J$ is $L_J$. Further, in this type of configuration, the effective inductance can be realized between Node A and Node B (and similarly between Node C and Node D), which can be expressed as:

$$L_{tot} = 2L_J \| 2L_J = L_J \quad \text{Equation 4.}$$

This type of configuration has a strong nonlinearity and a high-saturation power. It is noted that although the area A 220 is illustrated and described with respect to the first matrix junction 110, the other matrix junctions (e.g., the second matrix junction 112, the third matrix junction 114, and the fourth matrix junction 116) can also comprise respective areas. In some implementations, the area A 220 of the first matrix junction 110 is substantially the same as the respective areas of the other matrix junctions.

Further, the area A 220 can be defined as the total area enclosed by the junctions on the outside of the loop. For example, the area can be defined by the first Josephson junction $202_1$, the second Josephson junction $204_1$, the Nth Josephson junction $206_1$, the Nth Josephson junction $218_1$, the second Josephson junction $216_1$, and the first Josephson junction $214_1$. The areas of the other matrix junctions can be defined in a similar manner.

An issue that the disclosed aspects address is that, generally, a JRM that comprises one Josephson junction in respective arms of the JRM is very nonlinear (e.g., functions as a strong dispersive nonlinear medium) but can tolerate relatively low microwave powers. Further, a JRM that contains N Josephson junctions in respective arms of the JRM is weakly nonlinear (e.g., functions as a weak dispersive nonlinear medium, which needs to be pumped with stronger drive to achieve the same amount of mixing as the one Josephson junction counterpart), but it has the advantage of being able to tolerate relatively high microwave powers (because of the array of Josephson junctions).

To address the above and/or other issues, one or more embodiments described herein include systems, methods, devices, circuits, and JRMs that provide the advantages of both strong nonlinearity while tolerating relatively high microwave powers (because of the parallel arrays of Josephson junctions).

In various embodiments, the disclosed aspects can be associated with technologies such as, but not limited to, superconducting technologies, quantum hardware technologies, quantum amplifier technologies, tunable superconducting qubit technologies, microwave device technologies, quantum information processing technologies, and/or other technologies. The disclosed aspects can employ hardware and/or software to solve problems that are highly technical in nature, that are not abstract and that cannot be performed as a set of mental acts by a human. Further, some of the processes performed can be performed by one or more specialized computers (e.g., one or more specialized circuits, one or more specialized hardware, and so on) for carrying out defined processes and/or tasks related to a superconducting device and fabrication of the same. The disclosed aspects and/or components of the system, devices, and so on can be employed to solve new problems that arise through advancements in technologies mentioned above, such as, for example, superconducting technologies, quantum hardware technologies, quantum amplifier technologies, tunable superconducting qubit technologies, microwave device technologies, quantum information processing technologies and the like. One or more embodiments of the of the disclosed aspects can provide technical improvements to superconducting systems, quantum hardware systems, quantum amplifier systems, tunable superconducting qubit systems, microwave device systems, quantum information processing systems and/or other technical systems. One or more embodiments of the disclosed aspects can also provide technical improvements to a superconducting device by providing strong nonlinearity and tolerating relatively high microwave powers of the JRM and/or the superconducting device.

It is noted that although various aspects (e.g., devices, JRMs, and so on) are discussed in isolation, the various aspects can be integrated into another configuration to make a high saturation power parameter amplifier, a quantum limited amplifier, a lossless microwave mixer, and so on. As discussed herein, high-saturation power is a range between around minus 130 decibel-milliwatts (−130 dbm) and about minus 100 dbm (−100 dbm).

Figure 3:
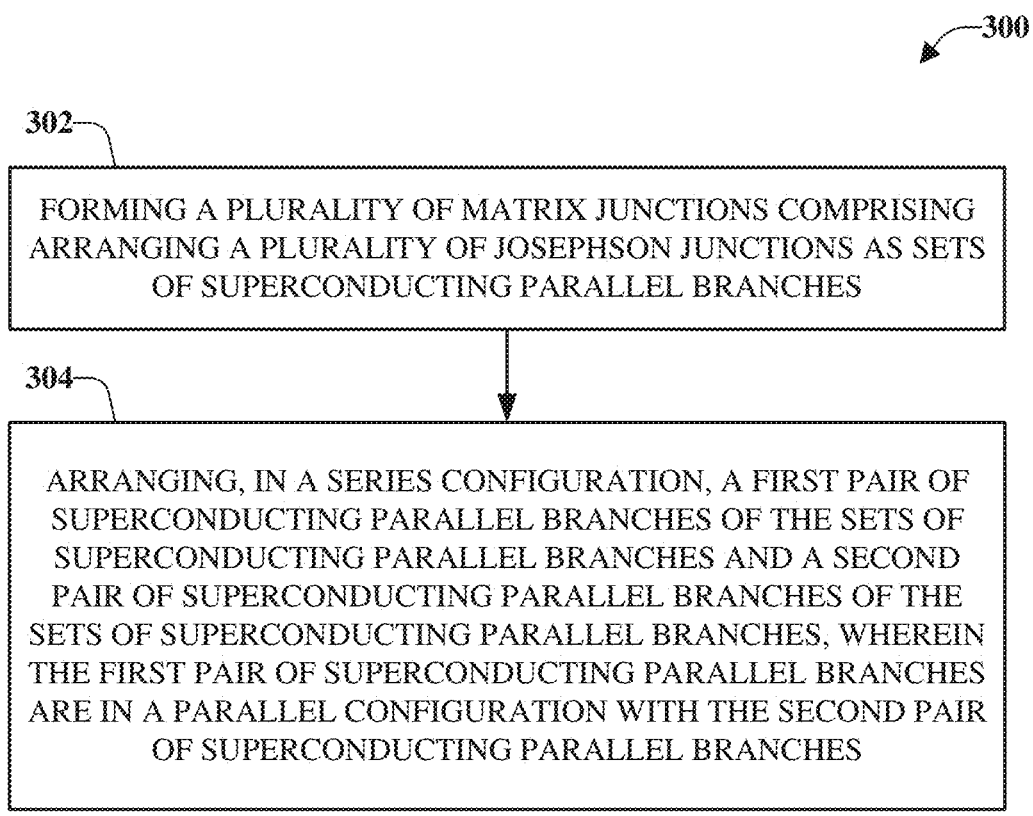
FIG. 3 illustrates a flow diagram of an example, non-limiting, method for fabrication of a Josephson ring modulator in accordance with one or more embodiments described herein.

FIG. 3 illustrates a flow diagram of an example, non-limiting, method 300 for fabrication of a Josephson ring modulator in accordance with one or more embodiments described herein. Repetitive description of like elements employed in other embodiments described herein is omitted for sake of brevity.

The method 300 can start, at 302, with forming a plurality of matrix junctions (e.g., the first matrix junction 110, the second matrix junction 112, the third matrix junction 114, and the fourth matrix junction 116). For example, forming the plurality of matrix junctions can comprise arranging a plurality of Josephson junctions as sets of superconducting parallel branches.

For example, for the first matrix junction 110, the Josephson junctions can comprise one or more of the first Josephson junction $202_1$, the second Josephson junction $204_1$, the Nth Josephson junction $206_1$, the first Josephson junction $208_1$, the second Josephson junction $210_1$, the Nth Josephson junction $212_1$, the first Josephson junction $214_1$, the second Josephson junction $216_1$, the Nth Josephson junction $218_1$. The superconducting parallel branches, for the first matrix junction 110, can comprise one or more of the first superconducting branch $118_1$, the second superconducting branch $120_1$, through the Nth superconducting branch $122_1$.

Further, at 304, the method 300 can comprise arranging, in a series configuration, a first pair of superconducting parallel branches of the sets of superconducting parallel branches and a second pair of superconducting parallel branches of the sets of superconducting parallel branches. The first pair of superconducting parallel branches can be in a parallel configuration with the second pair of superconducting parallel branches. For example, the first pair of superconducting parallel branches can comprise the superconducting parallel branches of the first matrix junction 110 and/or the second matrix junction 112. Further, the second pair of superconducting parallel branches can comprise the superconducting parallel branches of the third matrix junction 114 and/or the fourth matrix junction 116.

Figure 4:
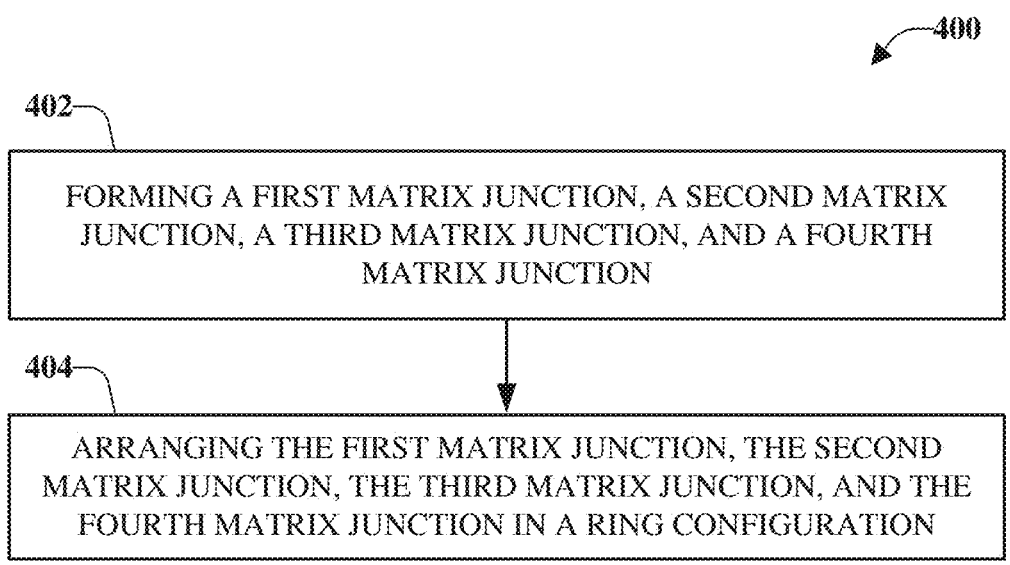
FIG. 4 illustrates a flow diagram of an example, non-limiting, method for forming one or more matrix junctions in accordance with one or more embodiments described herein.

FIG. 4 illustrates a flow diagram of an example, non-limiting, method 400 for forming one or more matrix junctions in accordance with one or more embodiments described herein. Repetitive description of like elements employed in other embodiments described herein is omitted for sake of brevity.

The method 400 can start, at 402, with forming a first matrix junction (e.g., the first matrix junction 110), a second matrix junction (e.g., the second matrix junction 112), a third matrix junction (e.g., the third matrix junction 114), and a fourth matrix junction (e.g., the fourth matrix junction 116).

Further, at 404, the method 400 can comprise arranging the first matrix junction, the second matrix junction, the third matrix junction, and the fourth matrix junction in a ring configuration. For example, the ring configuration can comprise a Wheatstone bridge configuration. Respective areas (e.g., the area A 220) encircled by the matrix junctions can be smaller or comparable to an area of the ring configuration, according to some implementations.

Figure 5:
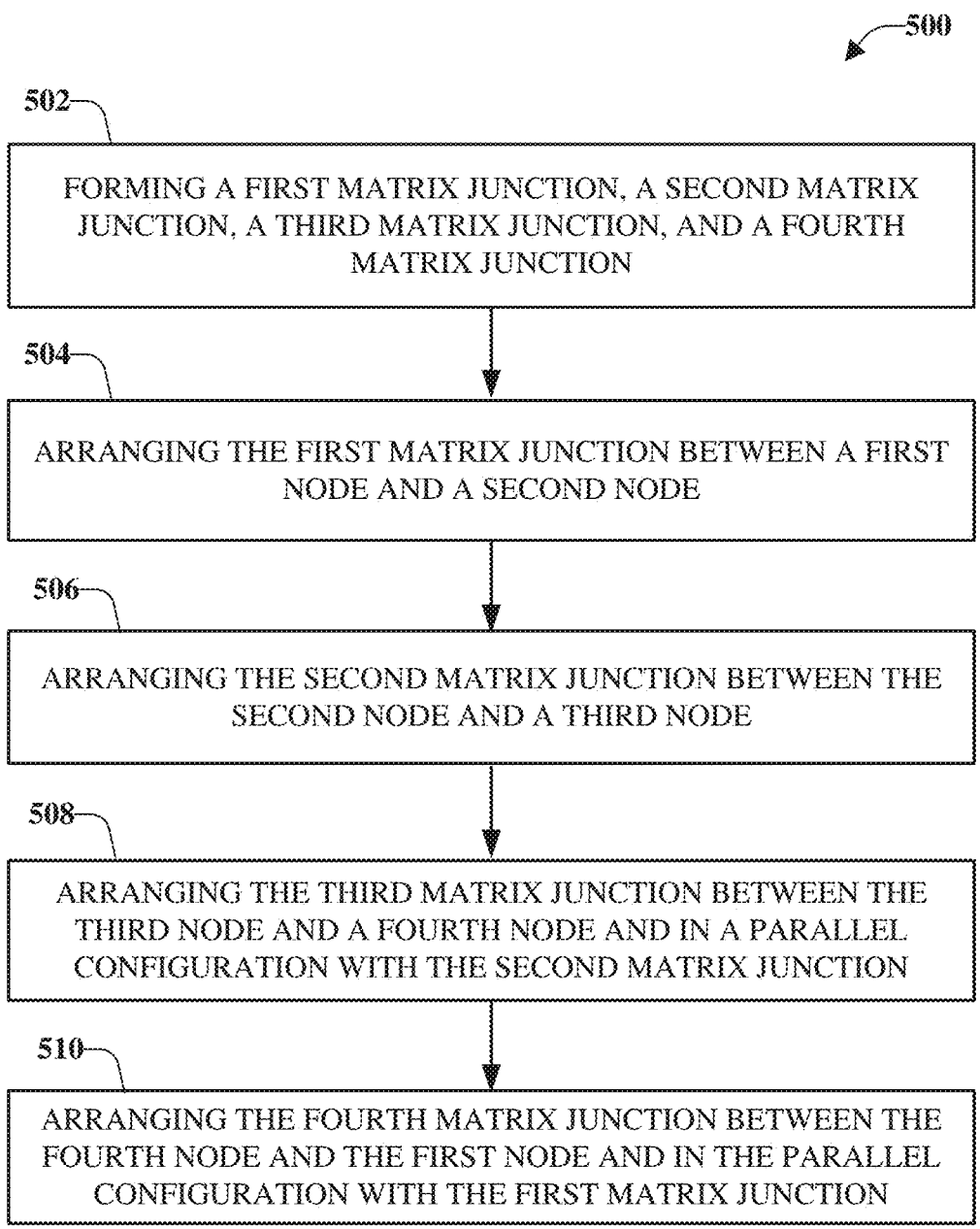
FIG. 5 illustrates a flow diagram of an example, non-limiting, method for arranging matrix junctions to form a Josephson ring modulator in accordance with one or more embodiments described herein.

FIG. 5 illustrates a flow diagram of an example, non-limiting, method 500 for arranging matrix junctions to form a Josephson ring modulator in accordance with one or more embodiments described herein. Repetitive description of like elements employed in other embodiments described herein is omitted for sake of brevity.

At 502 of the method 500, a first matrix junction (e.g., the first matrix junction 110), a second matrix junction (e.g., the second matrix junction 112), a third matrix junction (e.g., the third matrix junction 114), and a fourth matrix junction (e.g., the fourth matrix junction 116) can be formed. At 504 of the method 500, the first matrix junction can be arranged between a first node (e.g., the first node 102 or Node A) and a second node (e.g., the second node 104 or Node C). At 506 of the method 500, the second matrix junction can be arranged between the second node and a third node (e.g., the third node 106 or Node B). The third matrix junction can be arranged, at 508 of the method 500, between the third node and a fourth node (e.g., the fourth node 108 or Node D). Further, the third matrix junction can be formed in a parallel configuration with the second matrix junction. At 510 of the method 500, the fourth matrix junction can be arranged between the fourth node and the first node. The fourth matrix junction can be formed in a parallel configuration with the first matrix junction.

Figure 6:
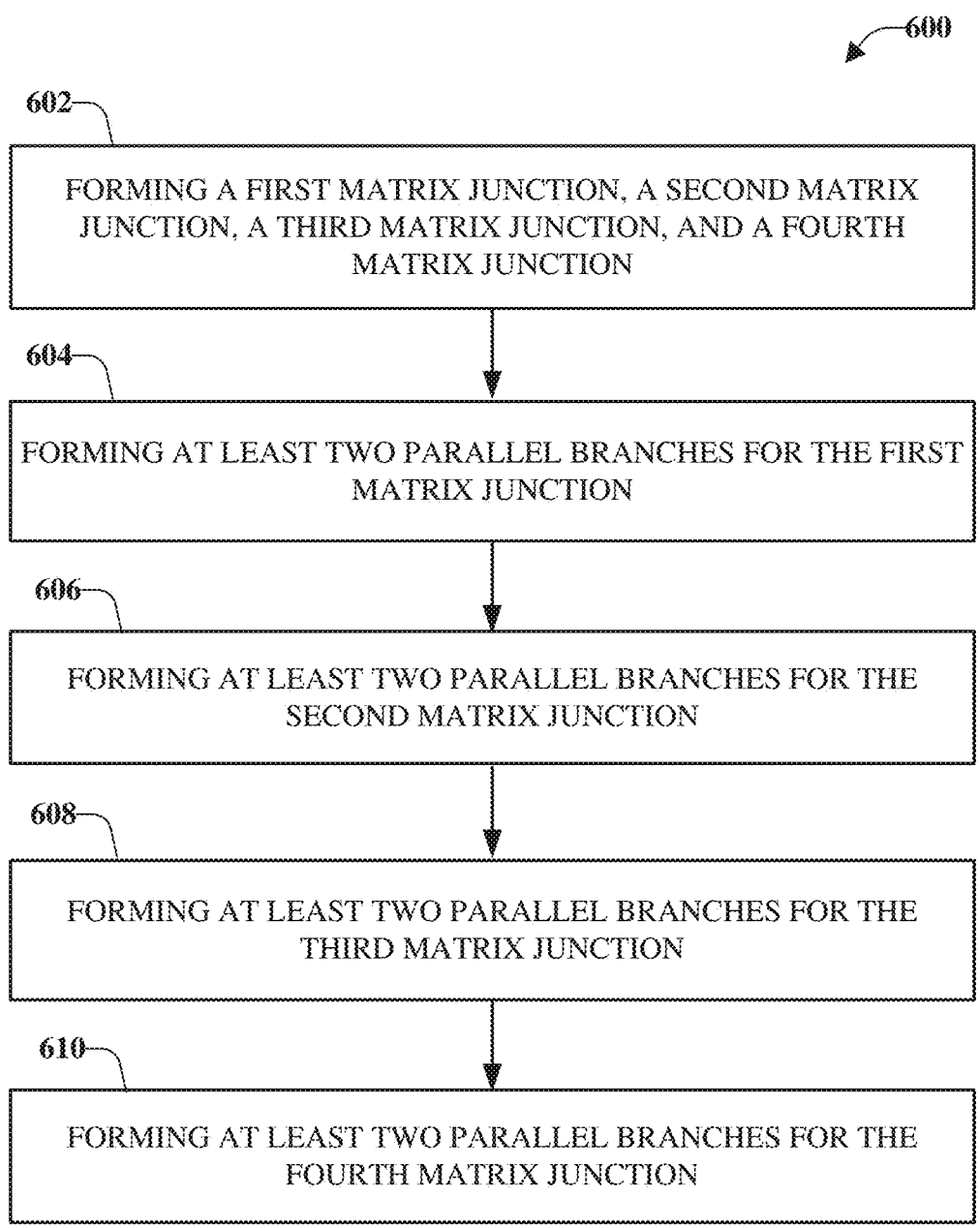
FIG. 6 illustrates a flow diagram of an example, non-limiting, method for forming one or more matrix junctions for a Josephson ring modulator in accordance with one or more embodiments described herein.

FIG. 6 illustrates a flow diagram of an example, non-limiting, method 600 for forming one or more matrix junctions for a Josephson ring modulator in accordance with one or more embodiments described herein. Repetitive description of like elements employed in other embodiments described herein is omitted for sake of brevity.

At 602 of the method 600, a first matrix junction (e.g., the first matrix junction 110), a second matrix junction (e.g., the second matrix junction 112), a third matrix junction (e.g., the third matrix junction 114), and a fourth matrix junction (e.g., the fourth matrix junction 116) can be formed.

For example, forming the first matrix junction can comprise, at 604 of the method 600, forming at least two parallel branches (e.g., at least two of the first superconducting branch $118_1$, the second superconducting branch $120_1$, and the Nth superconducting branch $122_1$) for the first matrix junction. Further, forming the second matrix junction can comprise, at 606 of the method 600, forming at least two parallel branches (e.g., at least two of the first superconducting branch $118_2$, the second superconducting branch $120_2$, through an Nth superconducting branch $122_2$) for the second matrix junction. Forming the third matrix junction can comprise, at 608 of the method 600, forming at least two parallel branches (e.g., at least two of the first superconducting branch $118_3$, the second superconducting branch $120_3$, through an Nth superconducting branch $122_3$). In addition, at 610 of the method 600, forming the fourth matrix junction can comprise forming at least two parallel branches (e.g., at least two of the first superconducting branch $118_4$, the second superconducting branch $120_4$, through an Nth superconducting branch $122_4$).

Figure 7:
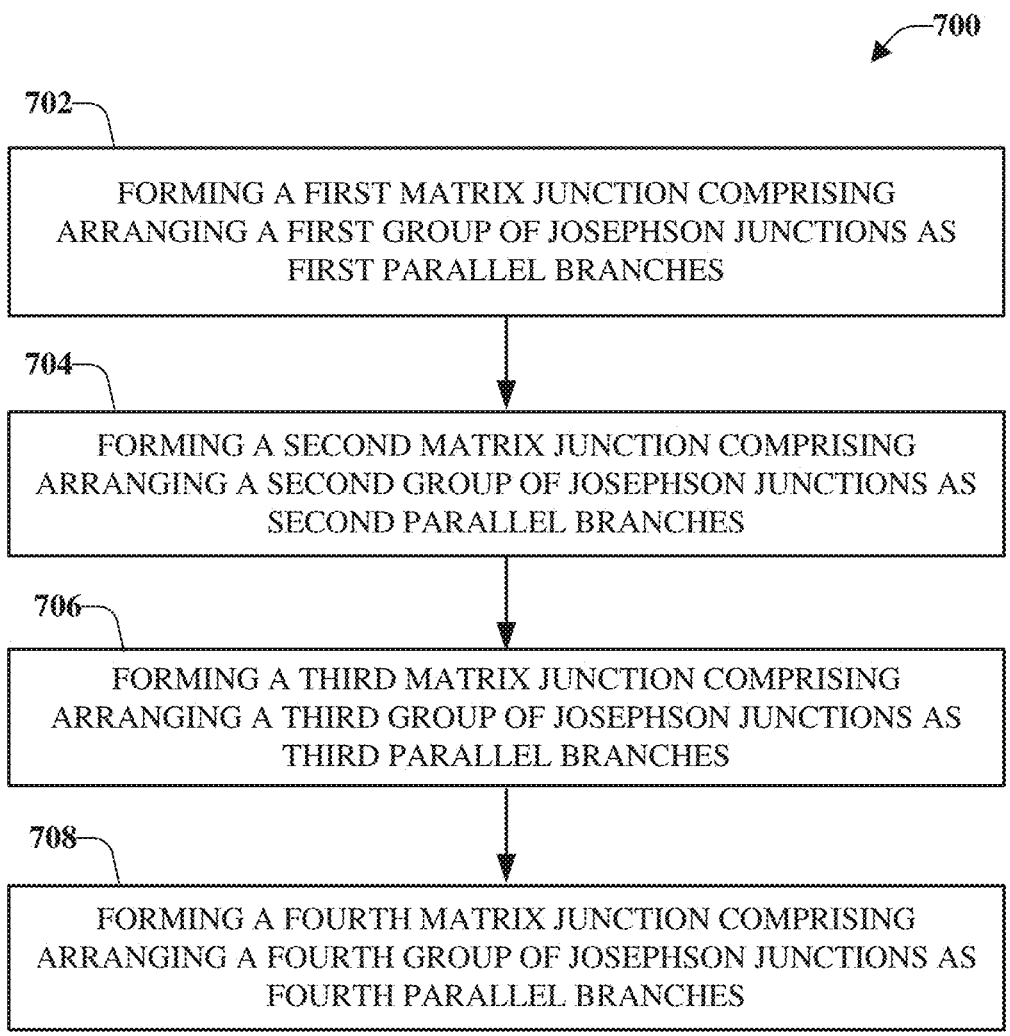
FIG. 7 illustrates a flow diagram of an example, non-limiting, method for fabrication of a Josephson ring modulator in accordance with one or more embodiments described herein.

FIG. 7 illustrates a flow diagram of an example, non-limiting, method 700 for fabrication of a Josephson ring modulator in accordance with one or more embodiments described herein. Repetitive description of like elements employed in other embodiments described herein is omitted for sake of brevity.

At 702 of the method 700, a first matrix junction (e.g., the first matrix junction 110) can be formed. Forming the first matrix junction can comprise arranging a first group of Josephson junctions as first parallel branches. For example, the first parallel branches can comprise two or more of the first superconducting branch $118_1$, the second superconducting branch $120_1$, and the Nth superconducting branch $122_1$. The first group of Josephson junctions can comprise one or more of the first Josephson junction $202_1$, the second Josephson junction $204_1$, and the Nth Josephson junction $206_1$; one or more of the first Josephson junction $208_1$, the second Josephson junction $210_1$, and the Nth Josephson junction $212_1$; and/or the first Josephson junction $214_1$, the second Josephson junction $216_1$, and the Nth Josephson junction $218_1$.

A second matrix junction (e.g., the second matrix junction 112) can be formed, at 704 of the method 700. Forming the second matrix junction can comprise arranging a second group of Josephson junctions as second parallel branches. For example, the second parallel branches can comprise two or more of the first superconducting branch $118_2$, the second superconducting branch $120_2$, and the Nth superconducting branch $122_2$. The second group of Josephson junctions can comprise one or more of the first Josephson junction $202_2$, the second Josephson junction $204_2$, and the Nth Josephson junction $206_2$; one or more of the first Josephson junction $208_2$, the second Josephson junction $210_2$, and the Nth Josephson junction $212_2$; and/or the first Josephson junction $214_2$, the second Josephson junction $216_2$, and the Nth Josephson junction $218_2$.

Further, at 706 of the method 700, a third matrix junction (e.g., the third matrix junction 114) can be formed. Forming the third matrix junction can comprise arranging a third group of Josephson junctions as third parallel branches. For example, the third parallel branches can comprise two or more of the first superconducting branch $118_3$, the second superconducting branch $120_3$, and the Nth superconducting branch $122_3$. The third group of Josephson junctions can comprise one or more of the first Josephson junction $202_3$, the second Josephson junction $204_3$, and the Nth Josephson junction $206_3$; one or more of the first Josephson junction $208_3$, the second Josephson junction $210_3$, and the Nth Josephson junction $212_3$; and/or the first Josephson junction $214_3$, the second Josephson junction $216_3$, and the Nth Josephson junction $218_3$.

The method 700 can also comprise, at 708, forming a fourth matrix junction (e.g., the fourth matrix junction 116). In an example, forming the fourth matrix junction can comprise arranging a fourth group of Josephson junctions as fourth parallel branches. For example, the fourth parallel branches can comprise two or more of the first superconducting branch $118_4$, the second superconducting branch $120_4$, and the Nth superconducting branch $122_4$. The fourth group of Josephson junctions can comprise one or more of the first Josephson junction $202_4$, the second Josephson junction $204_4$, and the Nth Josephson junction $206_4$; one or more of the first Josephson junction $208_4$, the second Josephson junction $210_4$, and the Nth Josephson junction $212_4$; and/or the first Josephson junction $214_4$, the second Josephson junction $216_4$, and the Nth Josephson junction $218_4$.

Figure 8:
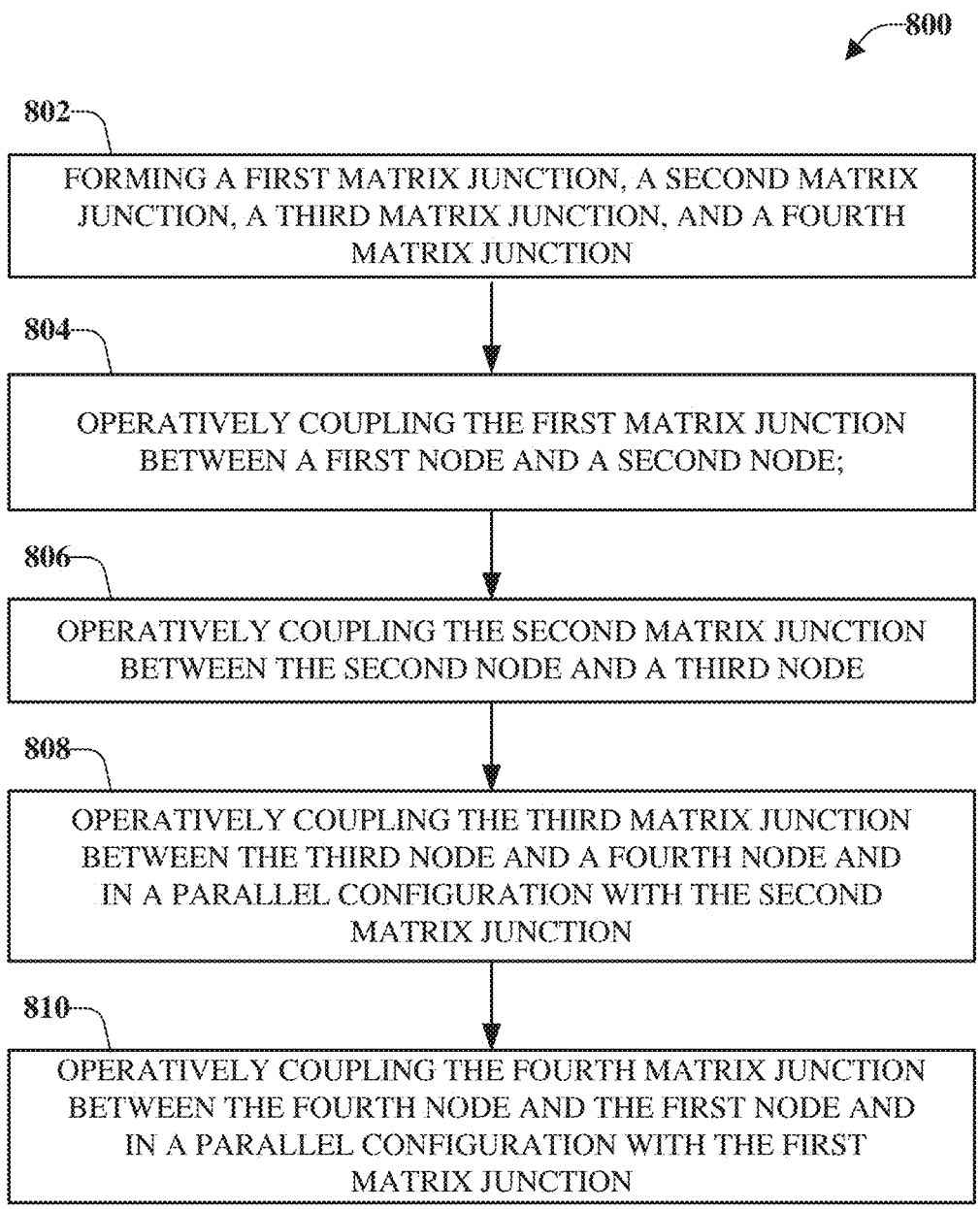
FIG. 8 illustrates a flow diagram of an example, non-limiting, method for coupling matrix junctions between nodes a Josephson ring modulator in accordance with one or more embodiments described herein.

FIG. 8 illustrates a flow diagram of an example, non-limiting, method 800 for coupling matrix junctions between nodes a Josephson ring modulator in accordance with one or more embodiments described herein. Repetitive description of like elements employed in other embodiments described herein is omitted for sake of brevity.

The method 800 can start, at 802, with forming a first matrix junction (e.g., the first matrix junction 110), a second matrix junction (e.g., the second matrix junction 112), a third matrix junction (e.g., the third matrix junction 114), and a fourth matrix junction (e.g., the fourth matrix junction 116). As discussed, forming the first matrix junction can comprise arranging a first group of Josephson junctions as first parallel branches. Forming the second matrix junction can comprise arranging a second group of Josephson junctions as second parallel branches. Forming the third matrix junction can comprise arranging a third group of Josephson junctions as third parallel branches. Further, forming the fourth matrix junction can comprise arranging a fourth group of Josephson junctions as fourth parallel branches.

At 804 of the method 800, the first matrix junction can be operatively coupled between a first node (e.g., the first node 102, Node A) and a second node (e.g., the second node 104, Node C) of the Josephson ring modulator. The method 800 can comprise, at 806, operatively coupling the second matrix junction between the second node and a third node (e.g., the third node 106, Node B). At 808, the method 800 can comprise operatively coupling the third matrix junction between the third node and a fourth node (e.g., a fourth node 108, Node D) and in a parallel configuration with the second matrix junction. Further, at 810, the method 800 can comprise operatively coupling the fourth matrix junction between the fourth node and the first node and in the parallel configuration with to the first matrix junction.

Figure 9:
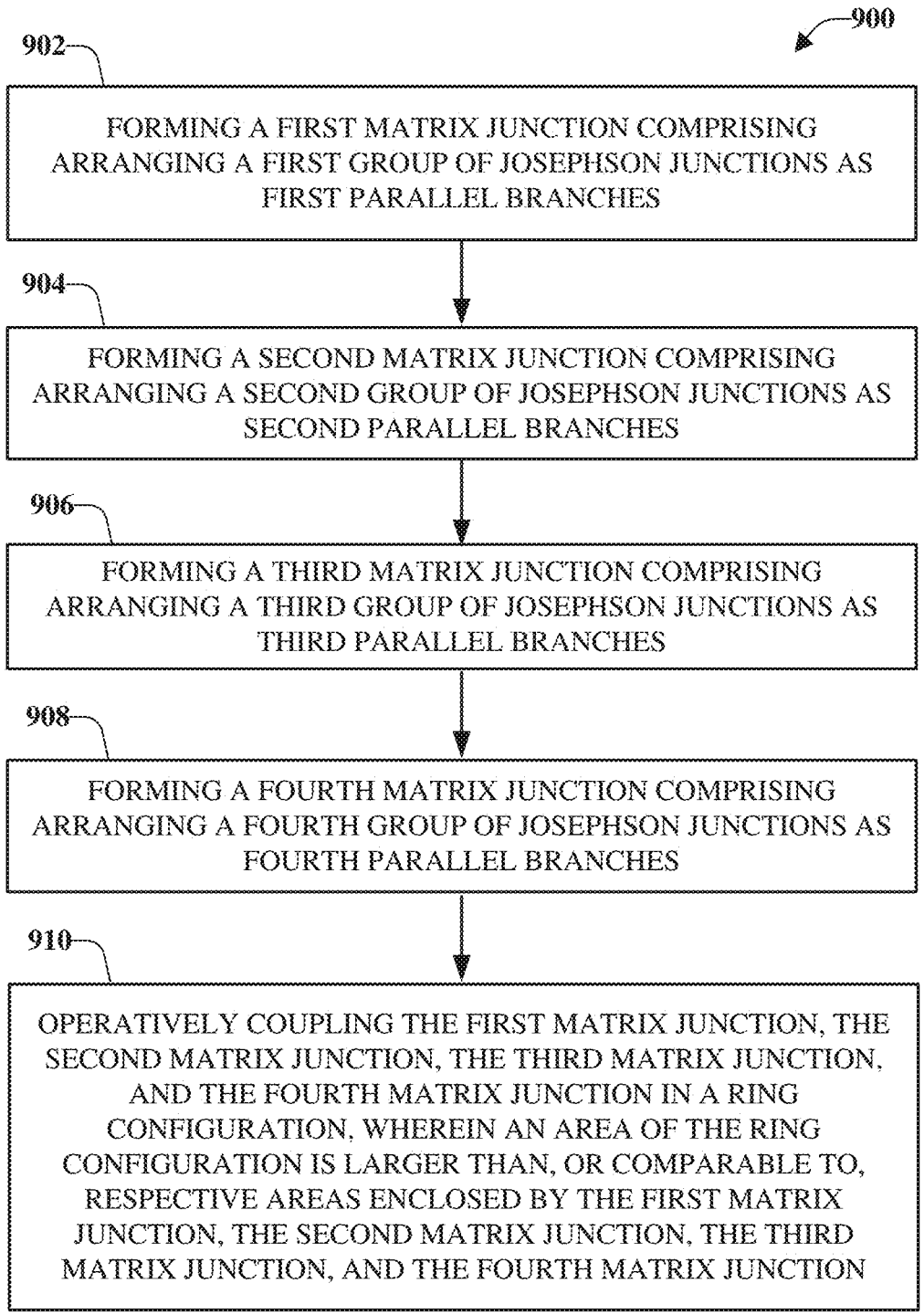
FIG. 9 illustrates a flow diagram of an example, non-limiting, method for coupling matrix junctions in a ring configuration in accordance with one or more embodiments described herein.

FIG. 9 illustrates a flow diagram of an example, non-limiting, method 900 for coupling matrix junctions in a ring configuration in accordance with one or more embodiments described herein. Repetitive description of like elements employed in other embodiments described herein is omitted for sake of brevity.

The method 900 can start, at 902, with forming a first matrix junction (e.g., the first matrix junction 110). Forming the first matrix junction can comprise arranging a first group of Josephson junctions as first parallel branches. At 904, the method 900 can comprise forming a second matrix junction (e.g., the second matrix junction 112). Forming the second matrix junction can comprise arranging a second group of Josephson junctions as second parallel branches. Further, at 906, the method 900 can comprise forming a third matrix junction (e.g., the third matrix junction 114). Forming the third matrix junction can comprise arranging a third group of Josephson junctions as third parallel branches. At 908, the method 900 can comprise forming a fourth matrix junction (e.g., the fourth matrix junction 116). Forming the fourth matrix junction can comprise arranging a fourth group of Josephson junctions as fourth parallel branches.

Further, at 910, the method 900 can comprise operatively coupling the first matrix junction, the second matrix junction, the third matrix junction, and the fourth matrix junction in a ring configuration. For example, the ring configuration can be a Wheatstone bridge configuration. According to an implementation, an area (e.g., the $A_{JRM}$ 222) of the ring configuration can be larger than, or comparable to, respective areas (e.g., the area 220) enclosed by the first matrix junction, the second matrix junction, the third matrix junction, and the fourth matrix junction.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
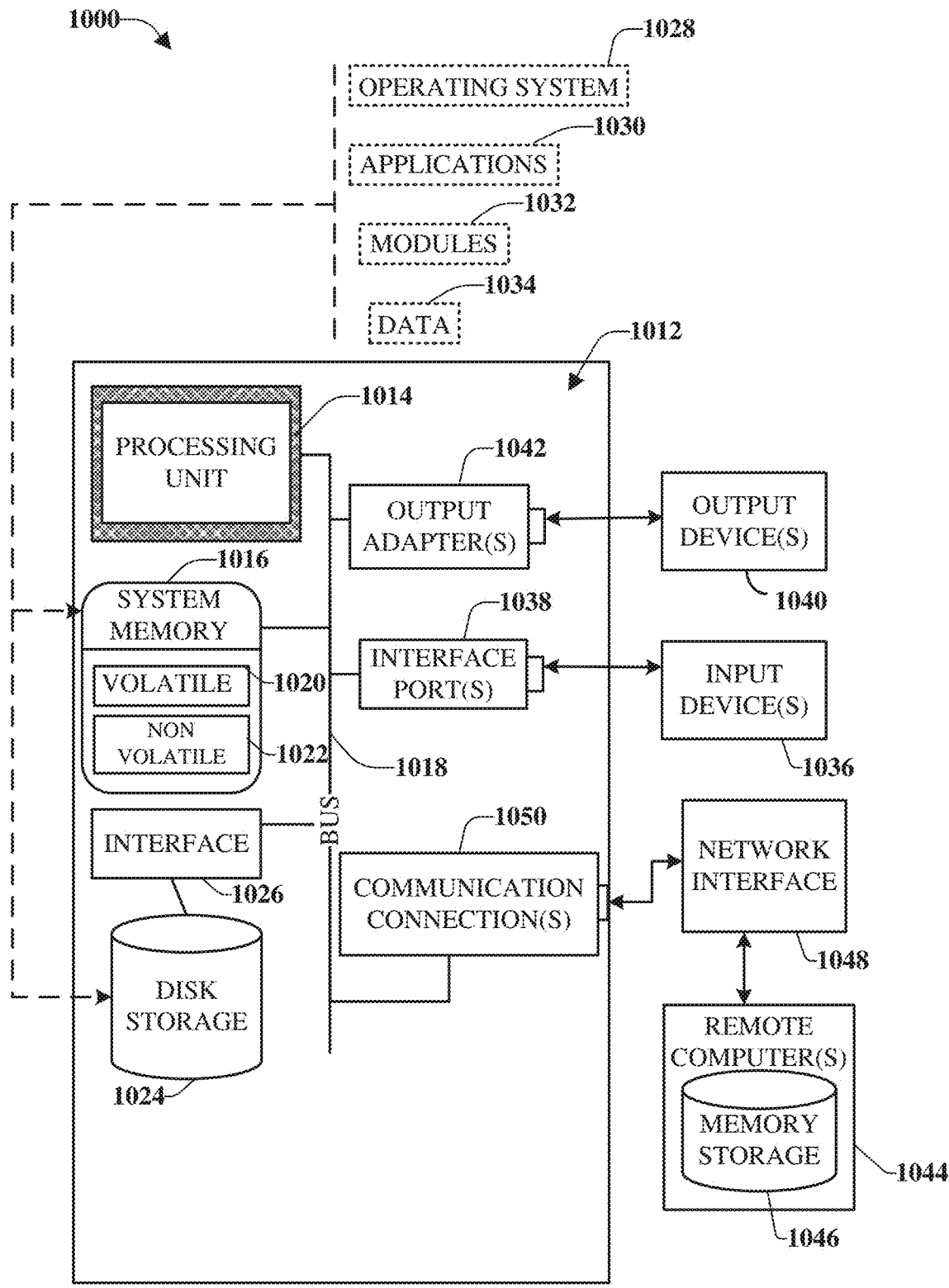
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/nonvolatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The one or more embodiments can be a system, a circuit, a method, an apparatus, and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing examples. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, example, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A Josephson ring modulator, comprising:
a plurality of matrix junctions, wherein matrix junctions of the plurality of matrix junctions comprise respective superconducting parallel branches that comprise a plurality of Josephson junctions, wherein the Josephson ring modulator is designed with a defined number of the Josephson junctions and superconducting parallel branches such that a number of the Josephson junctions per superconducting parallel branch equals a number of the superconducting parallel branches per matrix junction.

2. The Josephson ring modulator of claim 1, wherein the plurality of matrix junctions comprises a first matrix junction, a second matrix junction, a third matrix junction, and a fourth matrix junction operatively coupled in a ring configuration.

3. The Josephson ring modulator of claim 1, wherein the design of the Josephson ring modulator provides enhanced nonlinearity while tolerating high microwave powers of the Josephson ring modulator.

4. The Josephson ring modulator of claim 2, further comprising a first node, a second node, a third node, and a fourth node, wherein the first matrix junction is between the first node and the second node, the second matrix junction is between the second node and the third node.

5. The Josephson ring modulator of claim 4, wherein the third matrix junction is between the third node and the fourth node and in a parallel configuration with the second matrix junction.

6. The Josephson ring modulator of claim 5, wherein the fourth matrix junction is between the fourth node and the first node and in the parallel configuration with the first matrix junction, and wherein the third matrix junction is parallel to the first matrix junction and the fourth matrix junction is parallel to the second matrix junction.

7. The Josephson ring modulator of claim 2, wherein the first matrix junction, the second matrix junction, the third matrix junction, and the fourth matrix junction comprise a same number of superconducting parallel branches.

8. The Josephson ring modulator of claim 2, wherein the first matrix junction, the second matrix junction, the third matrix junction, and the fourth matrix junction comprise a same number of Josephson junctions in the series configuration.

9. The Josephson ring modulator of claim 1, wherein the plurality of matrix junctions are arranged in a Wheatstone bridge configuration.

10. The Josephson ring modulator of claim 1, wherein the plurality of matrix junctions are operatively coupled to a microwave resonator.

11. A method, comprising:
forming a plurality of matrix junctions comprising:
arranging a plurality of Josephson junctions as sets of superconducting parallel branches; and
arranging a first pair of superconducting parallel branches of the sets of superconducting parallel branches and a second pair of superconducting parallel branches of the sets of superconducting parallel branches, wherein the plurality of matrix junctions forms a Josephson ring modulator designed to have an equal number of Josephson junctions per superconducting parallel branch equals a number of superconducting parallel branches per matrix junction to enhance nonlinearity and toleration of high microwave power.

12. The method of claim 11, wherein the forming the plurality of matrix junctions comprises:
forming a first matrix junction, a second matrix junction, a third matrix junction, and a fourth matrix junction; and
arranging the first matrix junction, the second matrix junction, the third matrix junction, and the fourth matrix junction in a ring configuration.

13. The method of claim 12, further comprising arranging the first matrix junction between a first node and a second node, the second matrix junction between the second node and a third node, the third matrix junction between the third node and a fourth node and in the parallel configuration with the second matrix junction, and the fourth matrix junction between the fourth node and the first node and in the parallel configuration with the first matrix junction.

14. The method of claim 13, wherein the third matrix junction is parallel to the first matrix junction and the fourth matrix junction is parallel to the second matrix junction.

15. A superconducting device, comprising:
a Josephson ring modulator comprising a plurality of matrix junctions, wherein matrix junctions of the plurality of matrix junctions comprise superconducting parallel branches that comprise a plurality of Josephson junctions, wherein the superconducting device is integrated into a high-saturation power parameter amplifier, and wherein a number of the plurality of Josephson Junctions per superconducting parallel branch equals a number of the superconducting parallel branches per matrix junction.

16. The superconducting device of claim 15, wherein the plurality of matrix junctions comprises a first matrix junction, a second matrix junction, a third matrix junction, and a fourth matrix junction arranged in a ring configuration.

17. The superconducting device of claim 16, wherein the Josephson ring modulator further comprises a first node, a second node, a third node, and a fourth node, wherein the first matrix junction is between the first node and the second node, the second matrix junction is between the second node and the third node, the third matrix junction is between the third node and the fourth node and in a parallel configuration with the second matrix junction.

18. The superconducting device of claim 17, wherein the fourth matrix junction is between the fourth node and the first node and in the parallel configuration with the first matrix junction, wherein the third matrix junction is parallel to the first matrix junction and the fourth matrix junction is parallel to the second matrix junction.

19. The superconducting device of claim 16, wherein the plurality of matrix junctions are arranged in a Wheatstone bridge configuration.

20. A Josephson ring modulator, comprising:
a first matrix junction comprising a number of first superconducting branches arranged in parallel, wherein the first superconducting branches comprise a first number of Josephson junctions equal to the number of first superconducting branches;
a second matrix junction comprising a number of second superconducting branches arranged in parallel, wherein the second superconducting branches comprise a second number of Josephson junctions equal to the number of second superconducting branches;
a third matrix junction comprising a number of third superconducting branches arranged in parallel, wherein the third superconducting branches comprise a third number of Josephson junctions equal to the number of third superconducting branches; and a fourth matrix junction comprising a number of fourth superconducting branches arranged in parallel, wherein the fourth superconducting branches comprise a fourth number of Josephson junctions equal to the number of fourth superconducting branches.

\* \* \* \* \*